(12) United States Patent
Ando et al.

(10) Patent No.: US 9,349,832 B1
(45) Date of Patent: May 24, 2016

(54) SACRIFICIAL SILICON GERMANIUM CHANNEL FOR INVERSION OXIDE THICKNESS SCALING WITH MITIGATED WORK FUNCTION ROLL-OFF AND IMPROVED NEGATIVE BIAS TEMPERATURE INSTABILITY

(71) Applicant: International Business Machines Corporation, Armonk, NY (US)

(72) Inventors: Takashi Ando, Tuckahoe, NY (US); Eduard A. Cartier, New York, NY (US); Kevin K. Chan, Staten Island, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/950,388

(22) Filed: Nov. 24, 2015

Related U.S. Application Data

(63) Continuation of application No. 14/833,215, filed on Aug. 24, 2015.

(51) Int. Cl.
  *H01L 29/66* (2006.01)
  *H01L 29/51* (2006.01)
  *H01L 29/49* (2006.01)
  *H01L 29/06* (2006.01)

(52) U.S. Cl.
  CPC ...... *H01L 29/66545* (2013.01); *H01L 29/0649* (2013.01); *H01L 29/51* (2013.01); *H01L 29/6656* (2013.01)

(58) Field of Classification Search
  CPC ............ H01L 29/66545; H01L 29/517; H01L 29/495; H01L 29/4966
  USPC .......................................... 438/287, 585, 591
  See application file for complete search history.

(56) References Cited

U.S. PATENT DOCUMENTS

| | | | |
|---|---|---|---|
| 2009/0206413 A1* | 8/2009 | Cabral, Jr. ......... | H01L 21/28052 257/369 |
| 2012/0225545 A1* | 9/2012 | Fu ................... | H01L 21/823857 438/585 |
| 2013/0119473 A1* | 5/2013 | Kwon ............. | H01L 21/823807 257/368 |

OTHER PUBLICATIONS

List of IBM Patents or Patent Applications Treated as Related; YOR920150365US2, Date Filed: Nov. 24, 2015, pp. 1-2.
Takashi Ando, et al.,"Sacrificial Silicon Germanium Channel for Inversion Oxide Thickness Scaling With Mitigated Work Function Roll-Off and Improved Negative Bias Temperature Instability" U.S. Appl. No. 14/833,215, date filed Aug. 24, 2015.

* cited by examiner

*Primary Examiner* — Karen Kusumakar
(74) *Attorney, Agent, or Firm* — Cantor Colburn LLP; Vazken Alexanian

(57) ABSTRACT

A technique relates to forming a transistor. A dummy gate is formed on a substrate with spacers on both sides. A source and a drain are formed in the substrate, where the source and the drain are positioned under the spacers. An interlayer dielectric is formed on top of the substrate, the spacers, and the dummy gate. The interlayer dielectric is planarized along with part of the spacers and the dummy gate. The dummy gate is removed, thereby leaving an opening. A sacrificial layer is deposited on top of the substrate in a bottom of the opening. The sacrificial layer includes at least one of silicon germanium and/or germanium. The sacrificial layer is removed from the substrate in the bottom of the opening, thereby growing an interfacial oxide layer on the substrate in the opening. A high-κ dielectric layer is deposited on top of the interfacial oxide layer.

19 Claims, 16 Drawing Sheets

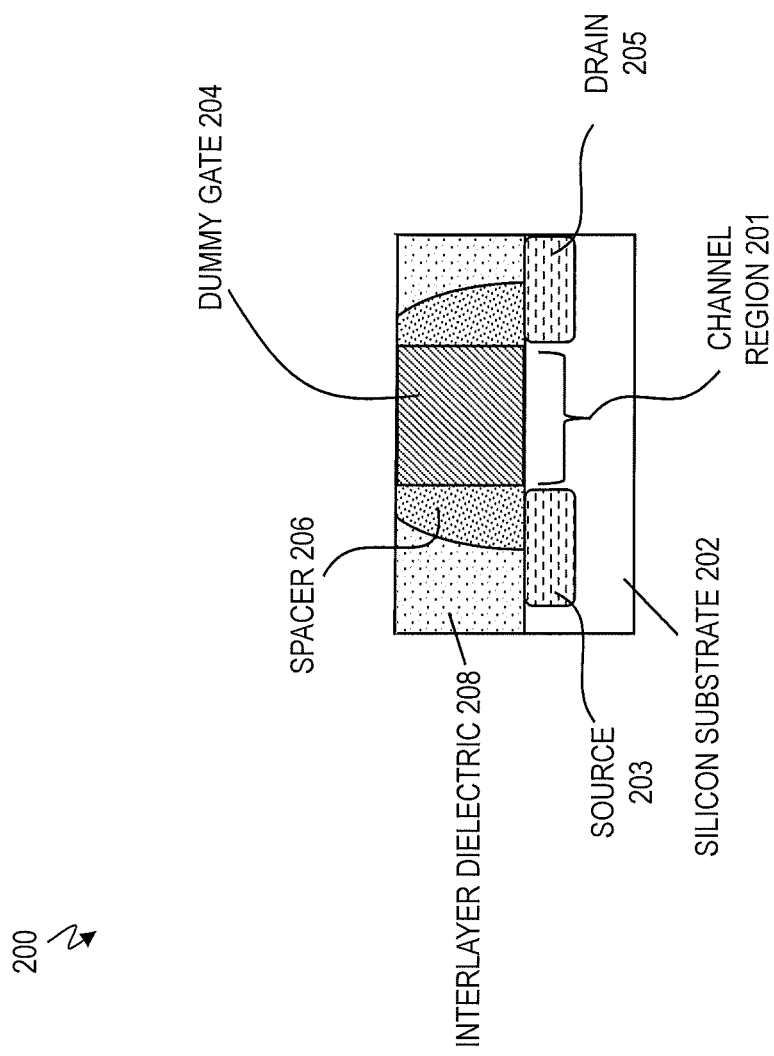

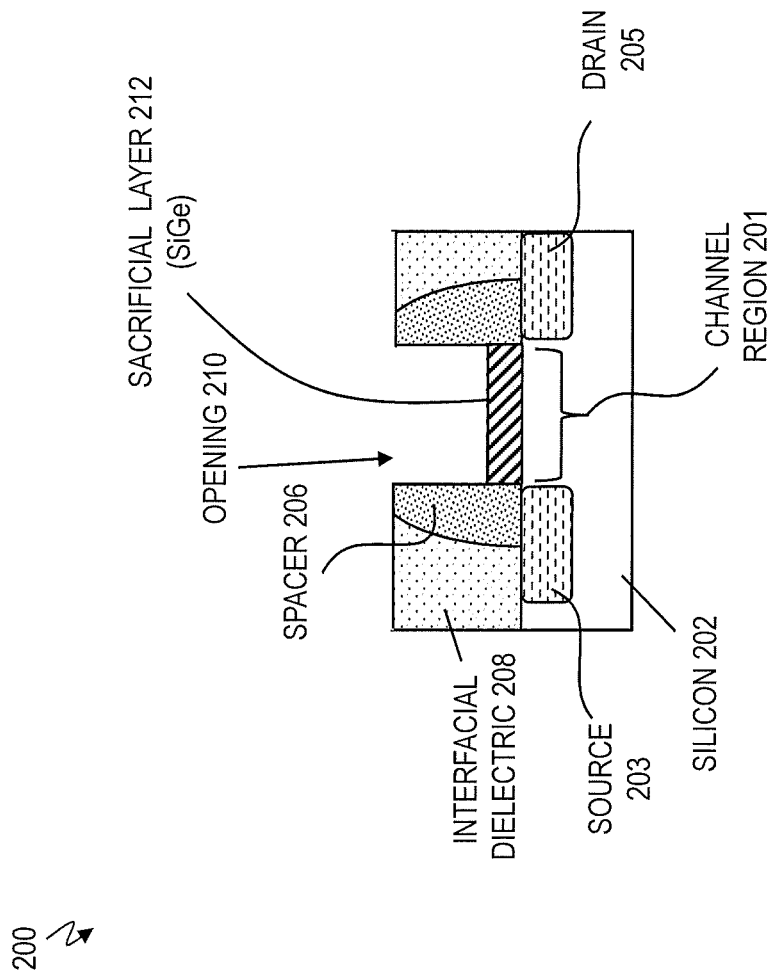

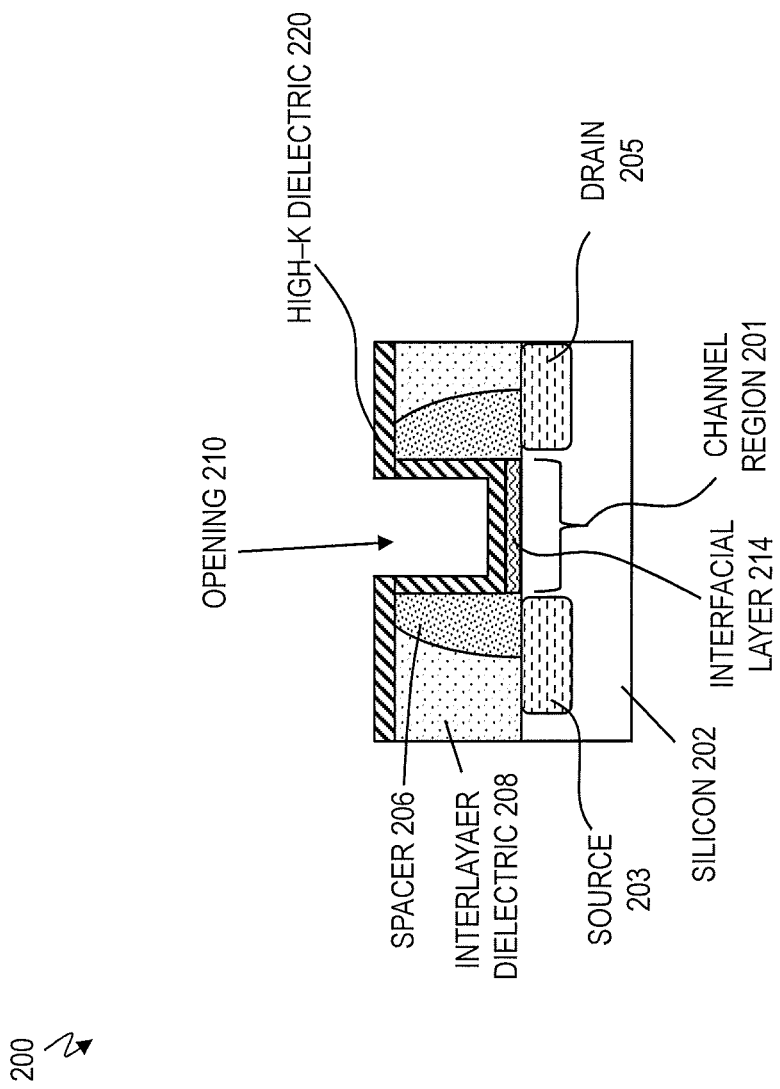

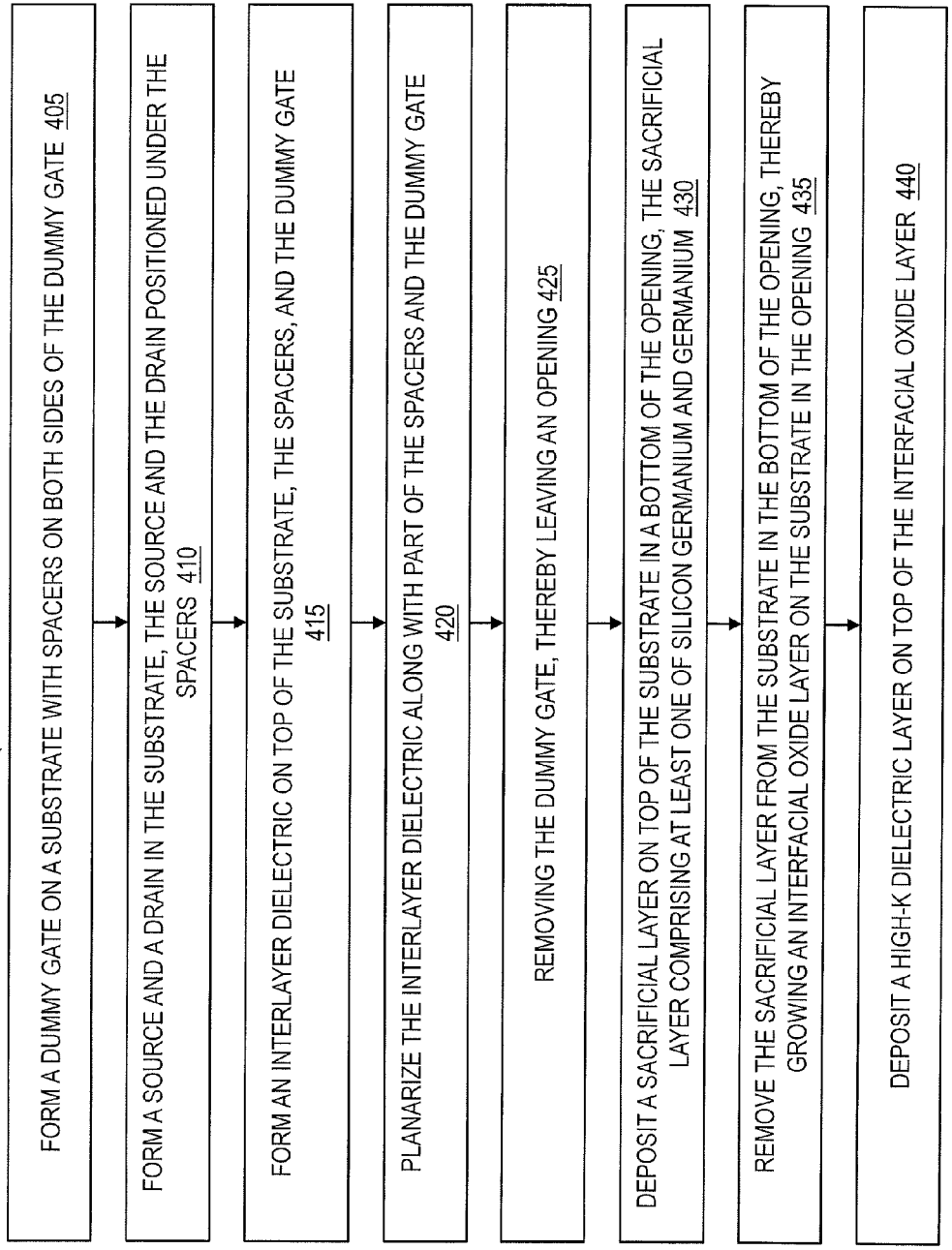

SACRIFICIAL SILICON GERMANIUM CHANNEL FOR INVERSION OXIDE THICKNESS SCALING WITH MITIGATED WORK FUNCTION ROLL-OFF AND IMPROVED NEGATIVE BIAS TEMPERATURE INSTABILITY

DOMESTIC PRIORITY

This application is a continuation of U.S. patent application Ser. No. 14/833,215, filed Aug. 24, 2015, the disclosure of which is incorporated by reference herein in its entirety.

BACKGROUND

The present invention relates to semiconductor devices, and more specifically, to using a sacrificial silicon germanium channel in fabricating transistors.

In building transistors, the replacement gate process architecture avoids the problems of work function material stability seen in the gate first architecture. However, the replacement gate architecture requires the insertion of new process modules into the flow, such as chemical mechanical polishing/planarization (CMP). The process is to form a dummy gate structure used to self-align the source and drain implant and anneals. The dummy gate materials are then stripped and replaced with the high-κ and metal gate materials. The flow forms an $SiO_2$ or SiON interface between the silicon substrate and the high-k dielectric. A thin layer of metal is then deposited above the high-k dielectric to set the work function, followed by deposition of low resistivity metal in the gate trench. This is followed by forming the source and drain, salicidation, and depositing the contact etch stop and first inter-layer dielectric. There are other variants of the deposition sequence as well.

SUMMARY

According to one embodiment, a method of forming a transistor is provided. The method includes forming a dummy gate on a substrate with spacers on both sides of the dummy gate, forming a source and a drain in the substrate, where the source and the drain are positioned under the spacers, and forming an interlayer dielectric on top of the substrate, the spacers, and the dummy gate. The method includes planarizing the interlayer dielectric along with part of the spacers and the dummy gate, removing the dummy gate, thereby leaving an opening, and depositing a sacrificial layer on top of the substrate in a bottom of the opening. The sacrificial layer comprises at least one of silicon germanium and/or germanium. Also, the method includes removing the sacrificial layer from the substrate in the bottom of the opening, thereby growing an interfacial oxide layer on the substrate in the opening, and depositing a high-κ dielectric layer on top of the interfacial oxide layer.

According to one embodiment, a method of forming a transistor is provided. The method includes depositing a sacrificial layer on top of a substrate, where the sacrificial layer comprises at least one of silicon germanium and/or germanium, forming a dummy gate on top of the sacrificial layer with spacers on both sides of the dummy gate, and forming a source and a drain in the substrate, where the source and the drain are positioned under the spacers. The method includes forming an interlayer dielectric on top of the sacrificial layer, the spacers, and the dummy gate, planarizing the interlayer dielectric along with part of the spacers and the dummy gate, and removing the dummy gate, thereby leaving an opening. Also, the method includes removing the sacrificial layer from the substrate in a bottom of the opening, thereby growing an interfacial oxide layer on the substrate in the opening, and depositing a high-κ dielectric layer on top of the interfacial oxide layer.

According to one embodiment, a transistor is provided. The transistor includes a sacrificial layer deposited on top of a substrate, where the sacrificial layer comprises at least one of silicon germanium and/or germanium, spacers formed on top of the sacrificial layer, the spacers formed to reflect an opening left by removal of a dummy gate, and an interfacial oxide layer formed on the substrate in the opening, where the substrate has been exposed by removal of the sacrificial layer within the opening. Further, the transistor includes a source and a drain formed in the substrate, where the source and the drain are positioned under the spacers, an interlayer dielectric formed on top of the sacrificial layer, the spacers, and the dummy gate, and a high-κ dielectric layer formed on top of the interfacial oxide layer.

BRIEF DESCRIPTION OF THE DRAWINGS

FIGS. 2A through 2G illustrate an exemplary fabrication process of forming a field effect transistor (FET) according to an embodiment, in which:

FIG. 2A is a cross-sectional view illustrating dummy gate formation of the transistor device according to an embodiment;

FIG. 2B is a cross-sectional view of the transistor device illustrating removal of the dummy gate according to an embodiment;

FIG. 2C is a cross-sectional view of the transistor device illustrating depositing a silicon germanium (SiGe) or germanium sacrificial layer according to an embodiment;

FIG. 2D is a cross-sectional view of the transistor device illustrating removal of the sacrificial layer according to an embodiment;

FIG. 2E is a cross-sectional view of the transistor device illustrating growth of an interfacial layer on the substrate by the removal of the sacrificial layer according to an embodiment;

FIG. 2F is a cross-sectional view of the transistor device illustrating deposition of a high-κ dielectric layer according to an embodiment; and FIG. 2G is a cross-sectional view of the transistor device illustrating further replacement metal gate fabrication processes.

FIGS. 3A through 3F illustrate an exemplary fabrication process of forming a field effect transistor (FET) according to another embodiment, in which:

FIG. 3A is a cross-sectional view illustrating deposition of a silicon germanium or germanium sacrificial layer on a substrate according to another embodiment;

FIG. 3B is a cross-sectional view illustrating dummy gate formation of the transistor device according to an embodiment;

FIG. 3C is a cross-sectional view of the transistor device illustrating removal of a dummy gate leaving an opening according to an embodiment;

FIG. 3D is a cross-sectional view of the transistor device illustrating removal of the sacrificial layer in the opening according to an embodiment;

FIG. 3E is a cross-sectional view of the transistor device illustrating growth of an interfacial layer on the substrate by the removal of the sacrificial layer according to an embodiment; and FIG. 3F is a cross-sectional view of the transistor device illustrating deposition of a high-κ dielectric layer and further replacement metal gate fabrication processes according to an embodiment.

FIG. 4 is a flow chart of forming a transistor device according to an embodiment.

DETAILED DESCRIPTION

Figure 1:
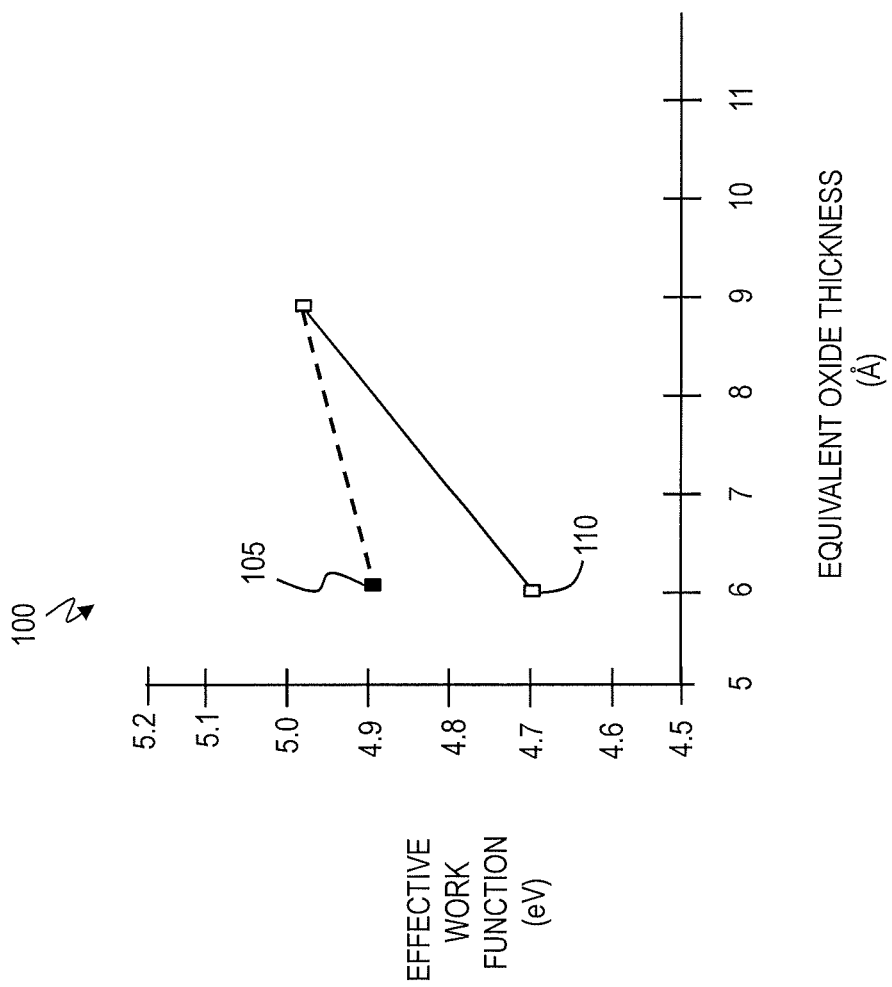
FIG. 1 is a graph illustrating an increase in the effective work function (EWF) for an exemplary technique compared to the state-of-the-art for the same equivalent oxide thickness (EOT) according to an embodiment.

It has been recognized that continued complementary metal-oxide-semiconductor (CMOS) device scaling requires a high-κ gate dielectric with a subnanometer equivalent oxide thickness (EOT). Scaling of a low-permittivity interfacial layer (IL) between a silicon (Si) substrate and a hafnium oxide ($HfO_2$) layer via scavenging reaction is gaining momentum in meeting this requirement. Most interfacial layer scavenging approaches require relatively high temperature chemical reactions, limiting their application to a gate-first process. Therefore, EOT scalability for the high-κ last replacement metal gate (HKL RMG) process has yet to be thoroughly investigated. In addition, it is reported that the effective work function (EWF) roll-off behavior emerges for an RMG process at EOT<9 angstroms (Å). Similar effective work function roll-off behaviors are initially reported for gate-first process at a much thicker EOT regime (approximately 30 Å), motivating many people to move to a gate-last process to realize low threshold voltage p-type field-effect transistors (pFETs). The effective work function roll-off behavior for the gate-first process is attributed to oxygen vacancy generation in an $HfO_2$ dielectric layer or a $SiO_2$ interfacial layer. However, oxygen vacancy generation typically requires a high temperature process (>600° C.) and the mechanism underlying the EWF roll-off for RMG process may need further investigation.

A typical high-κ metal gate (HKMG) stack structure contains a silicon oxide based interfacial layer (IL), a high-κ dielectric, followed by a metal gate electrode. This system is equivalent to two capacitors connected in series. Thus, the total EOT of the HKMG stack can be expressed as follows:

$$EOT=EOT_{IL}+EOT_{HK}$$

where $EOT_{IL}$ and $EOT_{HK}$ are contributions from the interfacial layer and high-κ layer, respectively. It may seem that an apparent way to scale $EOT_{HK}$ is to reduce the physical thickness of the high-κ layer, but there is little room in this direction. Further information is found in a paper by T. Ando., "Ultimate Scaling of High-κ Gate Dielectrics: Higher-K or Interfacial Layer Scavenging?" Materials, 5 [3], 478-500 (2012), which is incorporated herein by reference. Continued device scaling for future technology nodes requires reduction in equivalent oxide thickness (EOT) of gate dielectrics.

Additionally, negative bias temperature instability (NBTI) is an issue for high-κ metal gate stacks with scaled EOT (i.e., thickness inversion (Tiny)). Negative bias temperature instability is a reliability issue in metal-oxide-semiconductor field-effect transistor (MOSFETs). NBTI manifests as an increase in the threshold voltage and consequent decrease in drain current and transconductance of a MOSFET. The degradation exhibits logarithmic dependence on time. It is of immediate concern in p-channel MOS devices, since they almost always operate with negative gate-to-source voltage.

EOT scaling is typically achieved by 1) nitridation of interfacial layer or 2) interfacial layer scavenging. Both approaches are accompanied with significant NBTI degradation. Further information is found in the paper by E. Cartier et al., "Fundamental aspects of $HfO_2$-based high-κ metal gate stack reliability and implications on tiny-scaling", in IEDM Tech. Dig., pp. 18.4.1-18.4.4, Dec. 2011, which is incorporated herein by reference.

Further, effective work function (EWF) roll-off is another issue for high-κ metal gate stacks with scaled EOT (Tiny). Accordingly, pFET EOT (Tiny) scaling below 8 Å (actual thickness 12 Å) is hampered for this reason. Further information is found in a paper by T. Ando et al., "Origins of Effective Work Function Roll-Off Behavior for High-κ Last Replacement Metal Gate Stacks", IEEE Electron Device Lett., 34 [6], 729 (2013), which is incorporated herein by reference.

According to one or more embodiments, a technique enables EOT (Tiny) scaling down to EOT 6 Å (actual oxide thickness 10 Å) with negligible NBTI penalty compared to interfacial layer nitridation and/or oxygen scavenging (for pFET devices). Also, the technique mitigated EWF roll-off by 200 millivolts (mV) at EOT 6 Å (actual oxide thickness 10 Å) (for pFET devices).

An embodiment includes (1) growth of a sacrificial SiGe layer on a silicon channel, (2) removal of the sacrificial SiGe layer by wet etching (e.g., standard clean 1 (SC-1)), and (3) direct growth of the high-κ dielectric material on the location (i.e., silicon channel) where the sacrificial SiGe layer was removed.

FIG. 1 is a graph 100 illustrating an increase in effective work function (EWF) for the exemplary technique compared to the state-of-the-art for the same equivalent oxide thickness (EOT) according to an embodiment. When the EOT is 6 Å (for the interfacial layer (e.g., $SiO_2$) and dielectric layer (e.g., $HfO_2$) combined), the point 105 shows that the effective work function is 4.9 electron volts (eV) for the exemplar structure/technique according to an embodiment. However, when the EOT is 6 Å, the point 110 shows that the effective work function is about 4.7 eV for the state-of-the-art. The effective work function for the exemplary technique of embodiments is 0.2 eV (or 200 mV) greater than the effective work function of the state-of-the-art.

Figure 2B:
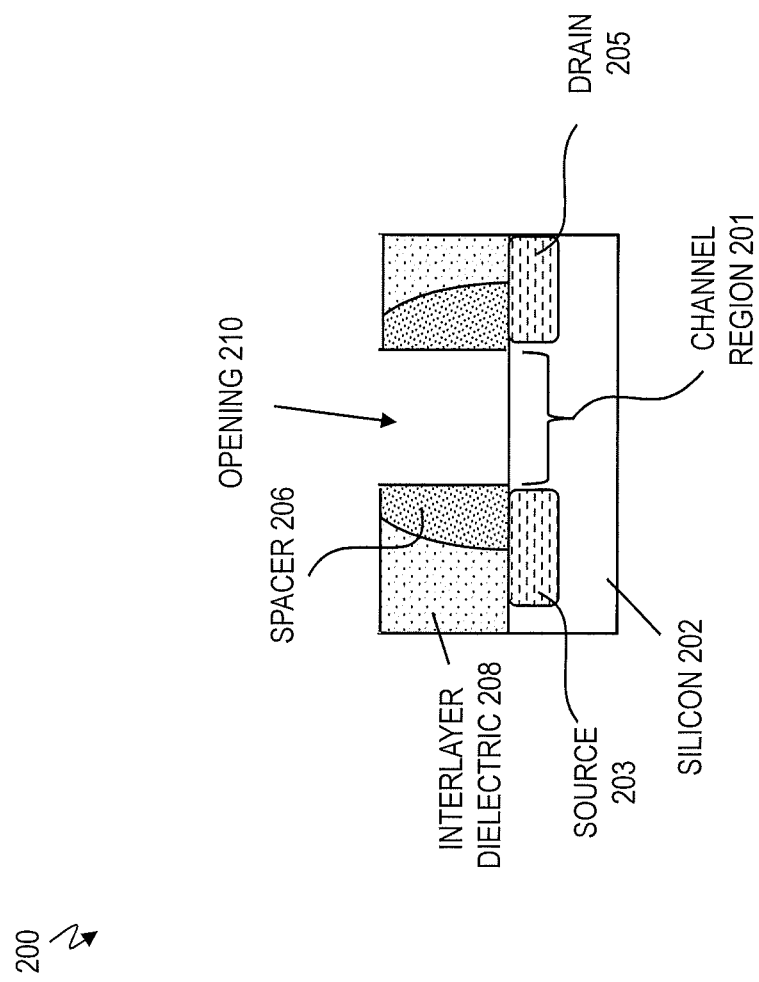

FIGS. 2A through 2G illustrate an exemplary fabrication process of forming a field effect transistor (FET) 200 according to an embodiment. FIG. 2A is a cross-sectional view illustrating dummy gate formation of the transistor device 200 according to an embodiment. A dummy gate 204 is formed on a substrate 202. The substrate 202 may be silicon (e.g., such as a silicon wafer). The dummy gate 204 may be polysilicon, oxide, and/or a nonmetal. A spacer 206 is formed on both sides of the dummy gate 204. The spacer may be a nitride. A source 203 and drain 205 may be implanted in the substrate 202. The source 203 and drain 205 may be p-type material (e.g., with p-type dopants) for forming a p-type transistor. A channel region 201 is under the dummy gate 204, and the channel 201 is created between the source 203 and drain 205 during operation. An interlayer dielectric layer 208 is deposited and the top surface of the transistor device 200 is planarized.

FIG. 2B is a cross-sectional view of the transistor device 200 illustrating removal of the dummy gate 204 from the transistor device 200 according to an embodiment. After removing the dummy gate 204, an opening 210 is left in the transistor 200. The opening 210 may be a trench.

FIG. 2C is a cross-sectional view of the transistor device 200 illustrating depositing a silicon germanium (SiGe) or germanium sacrificial layer 212 in the opening 210. The SiGe sacrificial layer 212 is deposited directly on the surface of the substrate 202. The SiGe sacrificial layer 212 may be grown on the silicon substrate 202. In one implementation, the SiGe sacrificial layer 212 is about 10 nanometers (nm) thick, which provides the benefits discussed herein. In another implementation, the SiGe sacrificial layer 212 may be approximately 1-10 nm thick. Optionally, the transistor device 200 may be annealed.

Figure 2D:
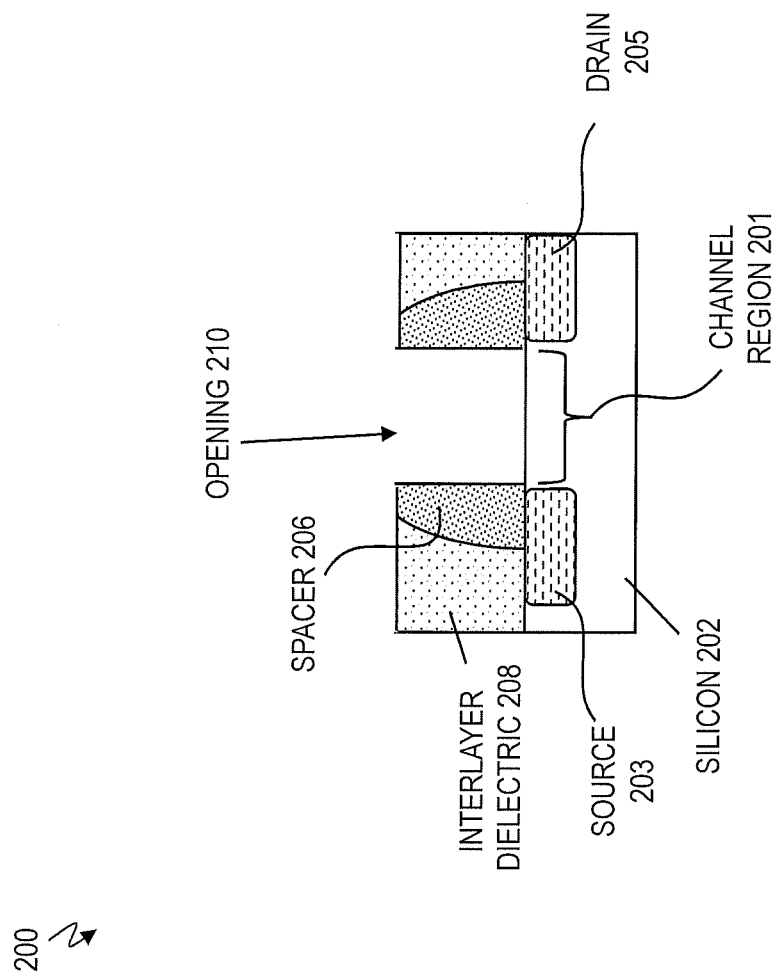

FIG. 2D is a cross-sectional view of the transistor device 200 illustrating removal of the SiGe sacrificial layer 212 from the opening 210. The SiGe sacrificial layer 212 may be removed by wet etching, for example SC-1 etching. Now, the opening 210 is down to the substrate 202.

By depositing (and then removing) the SiGe sacrificial layer 212 deposited in the channel region 201, the SiGe sacrificial layer 212 allows for scaling down to EOT 6 Å (EOT of hafnium oxide layer 220 plus EOT of interfacial oxide layer 214) with negligible NBTI penalty compared to interfacial layer nitridation and/or oxygen scavenging. Typically, EOT scaling (i.e., reduction) by 1 Å is accompanied by 100× (i.e., 100 times) degradation in NBTI lifetime. However, embodiments enable EOT scaling by 3.5 Å with a matched NBTI lifetime (or 10000000× improvement in NBTI lifetime at a matched (i.e., equal) EOT).

Also, by depositing and then removing the SiGe sacrificial layer 212 (305 in FIG. 3) in the channel region 201, EWF roll-off is reduced by 200 millivolts (mV) at EOT 6 Å (EOT of hafnium oxide layer 220 plus EOT of interfacial oxide layer 214). It is noted that annealing the transistor device 200 after depositing the SiGe sacrificial layer 212 helps to improve the quality of the interface between the Si substrate 202 and the interfacial oxide layer 214.

Figure 2E:
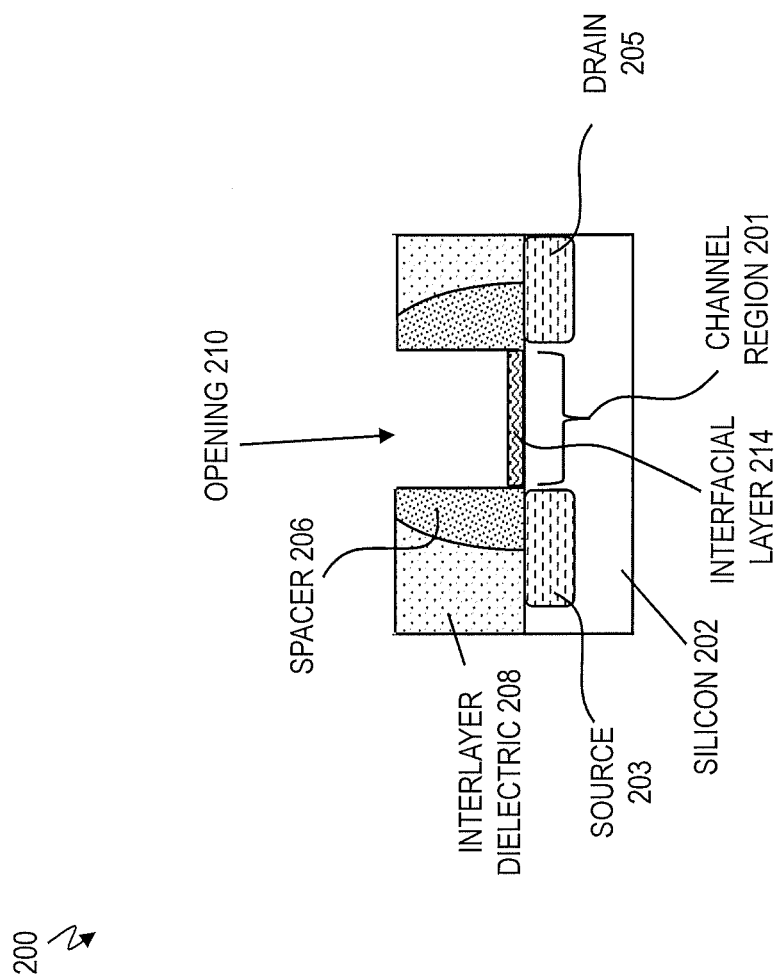

FIG. 2E is a cross-sectional view of the transistor device 200 illustrating growth of an interfacial layer 214 on the substrate 202 by the removal of the sacrificial layer 212. Since the SC1 chemistry (utilized by the SiGe removal operation) is known to grow a chemical oxide on a silicon surface, chemical oxide (i.e., interfacial layer 214) grown after removal of the SiGe sacrificial layer 212 is much thinner and more robust compared to a chemical oxide grown on a fresh Si surface (i.e., that did not first deposit and then remove the sacrificial layer 212 from the substrate 202). This more robust SiGe sacrificial layer 212 provides fewer dangling bonds, resulting in improved NBTI. The interfacial layer 214 is an oxide layer in the opening 210. For example, when the substrate 202 is silicon, the interfacial layer 214 is silicon dioxide.

FIG. 2F is a cross-sectional view of the transistor device 200 illustrating deposition of a high-κ dielectric layer 220. The high-κ dielectric layer 220 is deposited on the top surface of the transistor device 200. The high-κ dielectric layer 220 is deposited on top of the interfacial layer 214, on the walls and top of the spacer 206, and on top of the interlayer dielectric layer 208. The high-κ dielectric layer 220 is and/or includes hafnium oxide. In one implementation, the high-κ dielectric layer 220 may be deposited by atomic layer deposition (ALD).

Figure 2G:
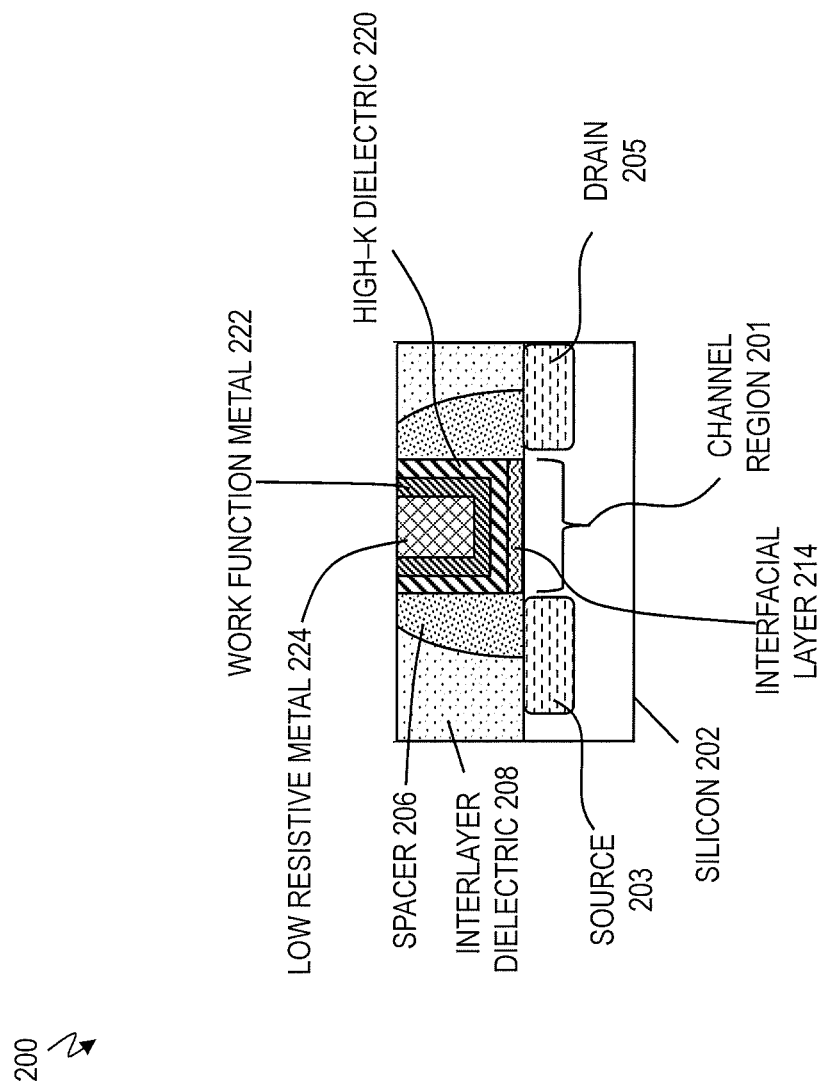

FIG. 2G is a cross-sectional view of the transistor device 200 illustrating further replacement metal gate fabrication processes. A work function metal 222 is deposited in the opening 210 on top of the high-κ dielectric layer 220. A low resistance metal 224 is deposited on top of the work function metal 222. The transistor device 200 may be planarized, for example, by chemical mechanical polishing/planarization. Examples of the work function metal 222 may include titanium nitride, titanium carbide, tantalum nitride, and/or tantalum carbide. Examples of the low resistance metal 224 may include tungsten, aluminum, etc.

As the high-κ dielectric layer 220, the thickness of the hafnium oxide (HfO$_2$) is approximately 15 angstroms (Å), which has an EOT of 3 Å. As the interfacial layer 214, the thickness of the silicon dioxide (SiO$_2$) can be as thin as 3 Å, which has an EOT 3 Å. Therefore, the combined EOT 6 Å of HfO$_2$ and SiO$_2$ (using SiGe sacrificial layer 212 and/or SiGe sacrificial layer 305 in FIG. 3) has a 200 mV improvement in effective work function (EWF) over a combined EOT 6 Å of HfO$_2$ and SiO$_2$ when no SiGe sacrificial layer 212 (and/or SiGe sacrificial layer 305 in FIG. 3) is used in the state-of-the-art.

FIGS. 3A through 3F illustrate an exemplary fabrication process of forming a field effect transistor (FET) 300 according to another embodiment. Both transistors 200 and 300 utilize the SiGe sacrificial gate layer but at different points during their fabrication process.

Figure 3A:
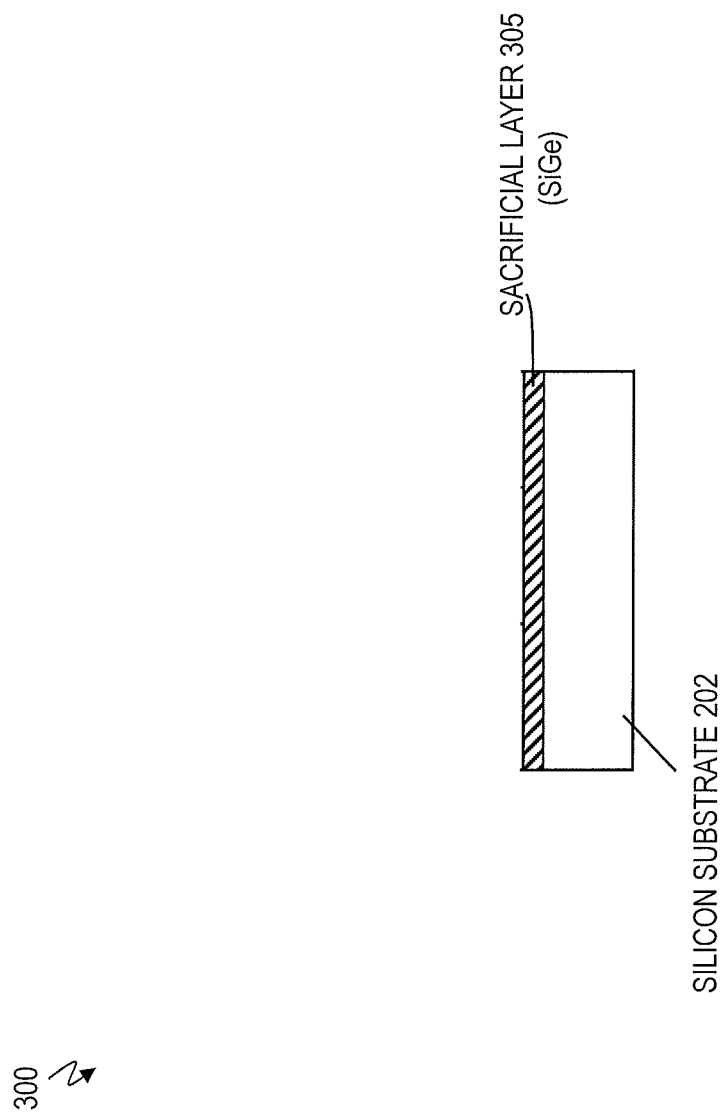

Similar to FIG. 2A, FIG. 3A is a cross-sectional view illustrating formation of the transistor device 300 according to another embodiment. A thin SiGe sacrificial layer 305 is deposited on top of the substrate 202. The thin SiGe sacrificial layer 305 is approximately 1-2 nm thick. The substrate 202 may be silicon (e.g., such as a silicon wafer).

Figure 3B:
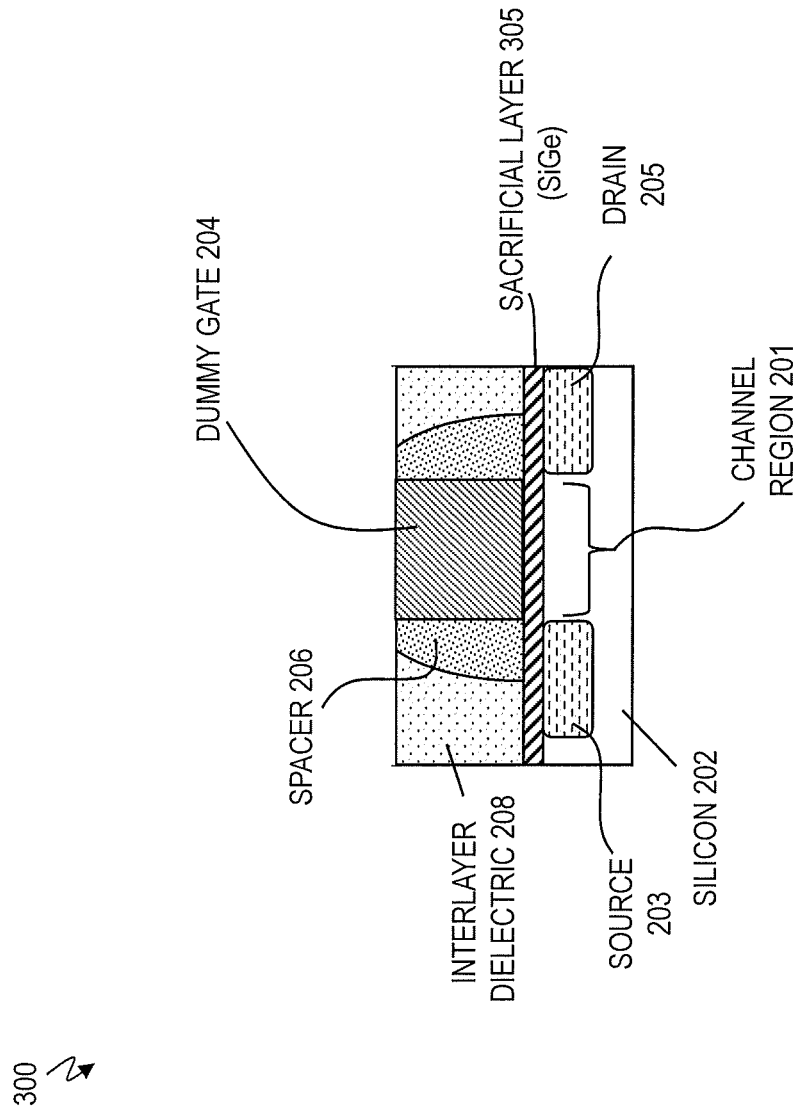

FIG. 3B is a cross-sectional view illustrating dummy gate formation of the transistor device 300 according to an embodiment. A dummy gate 204 is formed on top of the SiGe sacrificial layer 305 that is on top of the substrate 202. The dummy gate 204 may be polysilicon, oxide, and/or a non-metal. A spacer 206 is formed on both sides of the dummy gate 204. A source 203 and drain 205 may be implanted in the substrate 202. The source 203 and drain 205 may be p-type material (e.g., with p-type dopants) for building a p-type transistor. A channel region 201 is under the dummy gate 204, and the channel 201 is created between the source 203 and drain 205 during operation. An interlayer dielectric layer 208 is deposited and the top surface of the transistor device 200 is planarized.

Figure 3C:
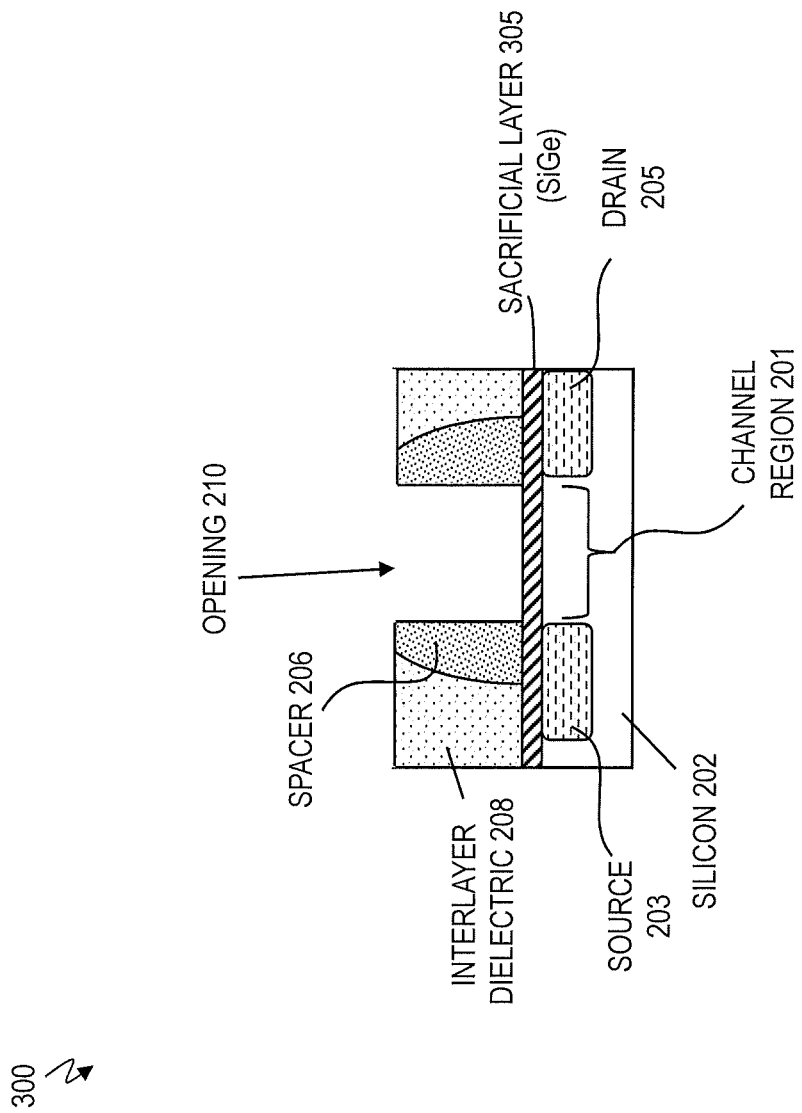

FIG. 3C is a cross-sectional view of the transistor device 300 illustrating removal of the dummy gate 204 that leaves opening 210 down to the SiGe sacrificial layer 305.

Figure 3D:
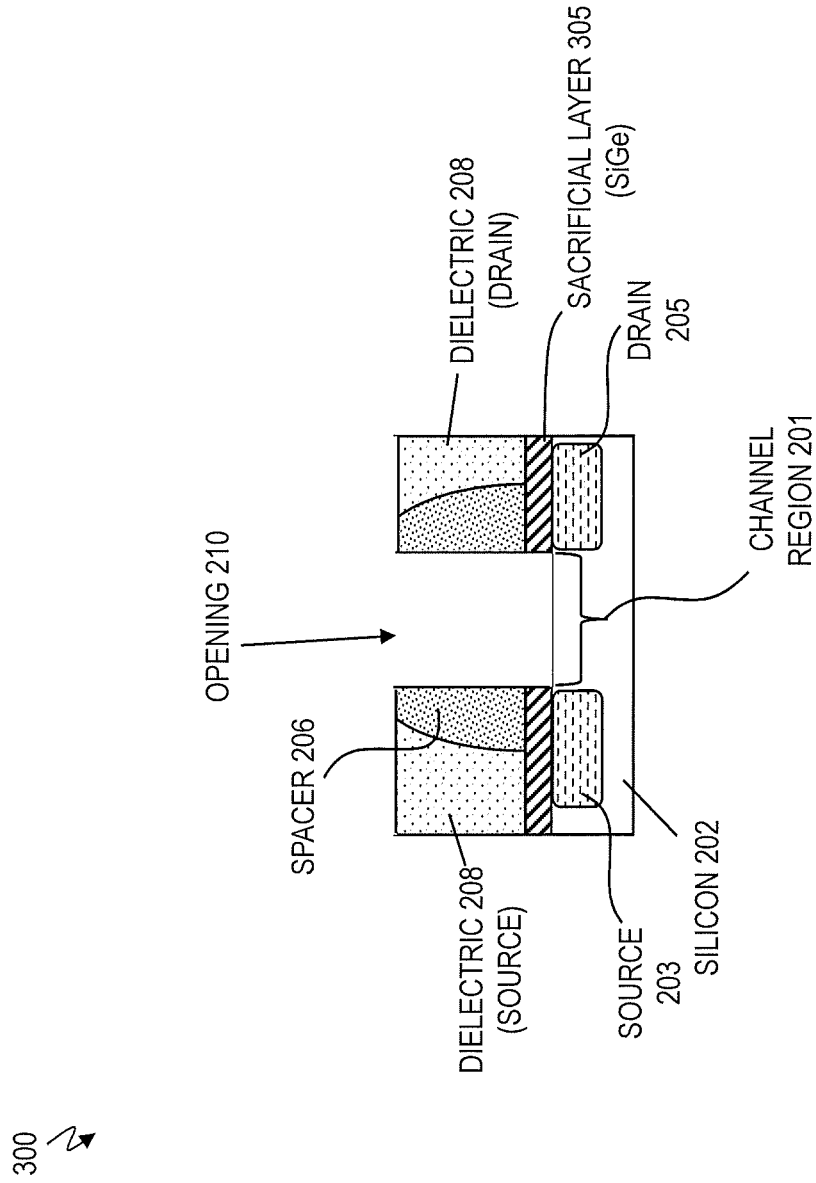

FIG. 3D is a cross-sectional view of the transistor device 300 illustrating removal of the SiGe sacrificial layer 305 from the opening 210. The SiGe sacrificial layer 212 may be removed by wet etching, for example SC-1 etching. Now, the opening 210 is down to the substrate 202.

Figure 3E:
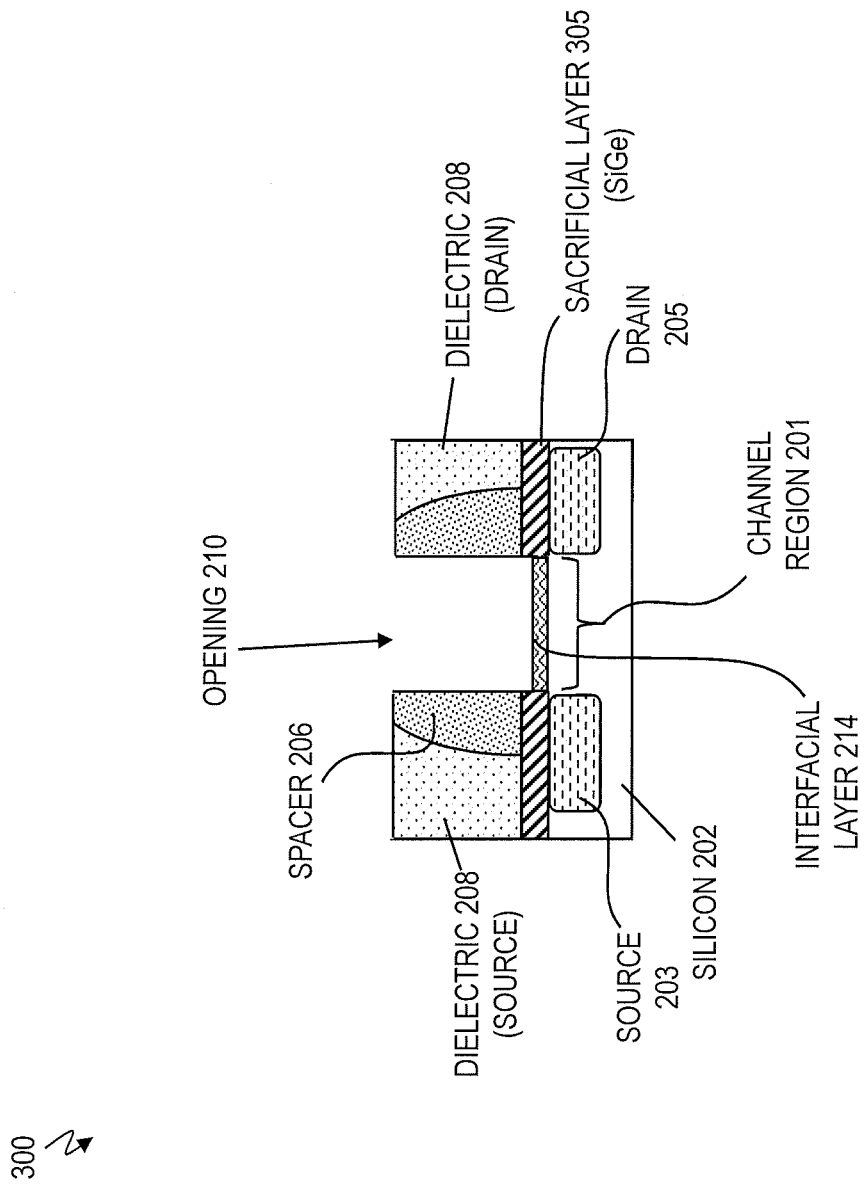

FIG. 3E is a cross-sectional view of the transistor device 300 illustrating growth of an interfacial layer 214 on the substrate 202 by the removal of the sacrificial layer 305. As noted above, since the SC1 chemistry (utilized by the SiGe removal operation) is known to grow a chemical oxide on a silicon surface, chemical oxide (i.e., interfacial layer 214) grown after removing the sacrificial layer 305 is much thinner and more robust compared to a chemical oxide grown on a fresh Si surface (i.e., without having first deposited and then removed the sacrificial layer 305). The interfacial layer 214 is an oxide layer in the opening 210. For example, when the substrate 202 is silicon, the interfacial layer 214 is silicon dioxide.

Figure 3F:
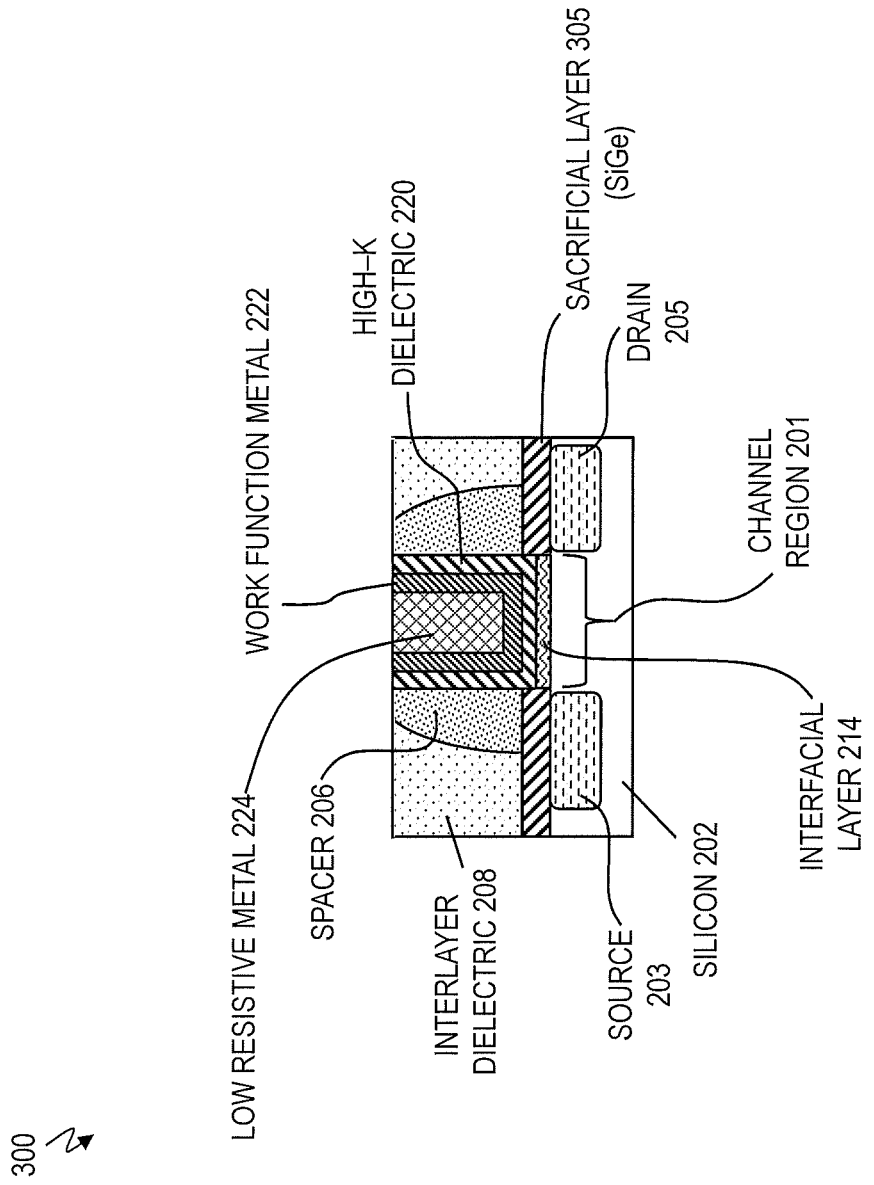

FIG. 3F is a cross-sectional view of the transistor device 300 illustrating deposition of a high-κ dielectric layer 220. The high-κ dielectric layer 220 is deposited on the top surface of the transistor device 200. The high-κ dielectric layer 220 is deposited on top of the interfacial layer 214, on the walls and top of the spacer 206, and on top of the interlayer dielectric layer 208. The high-κ dielectric layer 220 is and/or includes hafnium oxide. In one implementation, the high-κ dielectric layer 220 may be deposited by atomic layer deposition (ALD).

Additionally, FIG. 3F illustrates further replacement metal gate fabrication processes. A work function metal 222 is deposited in the opening 214 on top of the high-κ dielectric layer 220. A low resistance metal 224 is deposited on top of the work function metal 222. The transistor device 200 may be planarized. Examples of the work function metal 222 may include titanium nitride, titanium carbide, tantalum nitride, and/or tantalum carbide. Examples of the low resistance metal 224 may include tungsten, aluminum, etc.

FIG. 4 is a flow chart 400 of a method of forming the transistor device 200 according to an embodiment.

At block 405, the dummy gate 204 is formed on the substrate 202 with spacers 206 on both sides of the dummy gate 204. At block 410, the source 203 and the drain 205 are formed in the substrate 202, where the source and the drain are positioned under the spacers 206.

At block 415, the interlayer dielectric layer 208 is formed on top of the substrate 202, the spacers 206, and the dummy gate 204. At block 420, the top of the interlayer dielectric layer 208 is planarized along with the top part of the spacers 206 and the dummy gate 204, as depicted in FIG. 2A.

At block 425, the dummy gate 204 is removed, thereby leaving the opening 210, as depicted in FIG. 2B. At block 430, the sacrificial layer 212 is deposited on top of the substrate 202 in a bottom of the opening 210, where the sacrificial layer 212 comprises at least one of silicon germanium and/or germanium, as depicted in FIG. 2C.

At block 435, the sacrificial layer 212 is removed from the substrate 202 in the bottom of the opening 210, thereby growing the interfacial oxide layer 214 on the substrate 202 in the opening 210, depicted in FIGS. 2D and 2E.

At block 440, the high-κ dielectric layer 220 is deposited on top of the interfacial oxide layer 214, as depicted in FIG. 2F.

A work function metal 222 is deposited on top of the high-κ dielectric layer 220, and a low resistance metal 224 is deposited on top of the work function metal 222. The top surface of the transistor device 200 may be planarized.

The combined equivalent oxide thickness (EOT) of the high-κ dielectric layer 220 and the interfacial oxide layer 214 is 6 angstroms. For the EOT of 6 angstroms, an effective work function is 200 millivolts higher as compared to when the sacrificial layer 212 is not deposited and removed from the substrate (given that all other steps in the fabrication process are the same).

In one implementation, the sacrificial layer 212 is about 10 nanometers thick. In another implementation, the sacrificial layer 212 is approximately 10 nanometers or less thick (but greater than 0 nm). In yet another implementation, the sacrificial layer 212 is approximately 1-10 nanometers thick.

The high-κ dielectric layer 220 has an EOT of 3 angstroms, while the interfacial oxide layer 214 has an EOT of 3 angstroms.

Figure 5:
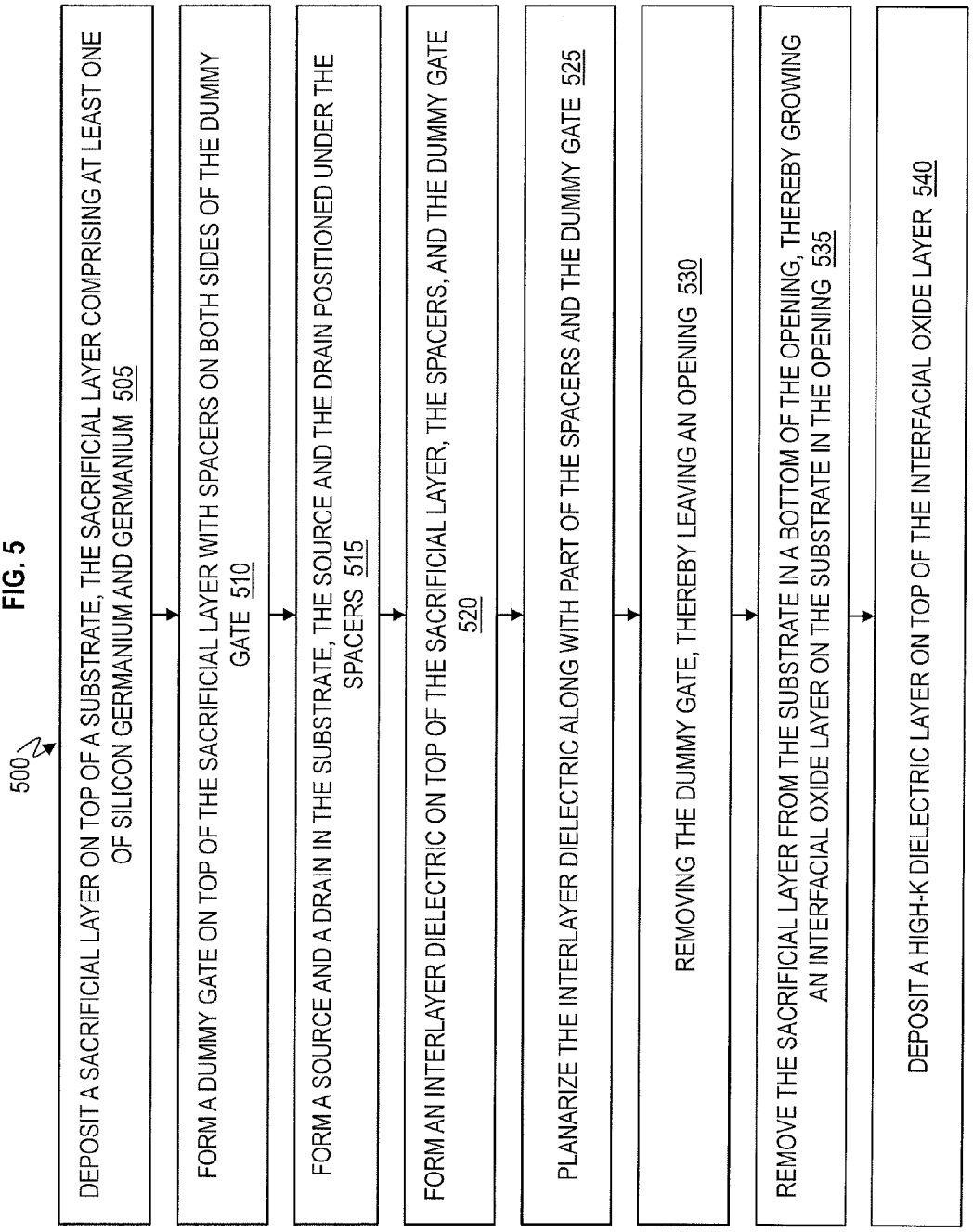
FIG. 5 is a flow chart of forming a transistor device according to another embodiment.

FIG. 5 is a flow chart 500 of a method of forming the transistor device 300 according to an embodiment.

At block 505, the sacrificial layer 305 is deposited on top of the substrate 202, where the sacrificial layer 305 comprises at least one of silicon germanium and germanium, as depicted in FIG. 3A.

At block 510, the dummy gate 204 is formed on top of the sacrificial layer 305 with spacers 206 on both sides of the dummy gate 204, as depicted in FIG. 3B. At block 515, the source 203 and drain 205 are formed in the substrate 202, and the source and the drain are positioned under the spacers.

At block 520, the interlayer dielectric 208 is formed on top of the sacrificial layer 305, the spacers 206, and the dummy gate 204. At block 525, the top of the interlayer dielectric 208 is planarized along with the top part of the spacers 206 and the dummy gate 204. FIG. 3B only illustrates after planarization.

At block 530, the dummy gate 204 is removed, thereby leaving an opening 210, as depicted in FIG. 3C. At block 535, the sacrificial layer 305 is removed from the substrate 202 in the bottom of the opening 210, thereby growing an interfacial oxide layer 214 on the substrate 202 in the opening 210, as depicted in FIGS. 3D and 3E.

At block 540, the high-κ dielectric layer 220 is deposited on top of the interfacial oxide layer 214, as depicted in FIG. 3F.

A work function metal 222 is deposited on top of the high-κ dielectric layer 220, and a low resistance metal 224 is deposited on top of the work function metal 222. The top surface of the transistor device 200 may be planarized.

The combined equivalent oxide thickness (EOT) of the high-κ dielectric layer 220 and the interfacial oxide layer 214 is 6 angstroms. For the combined EOT of 6 angstroms, an effective work function is 200 millivolts higher as compared to when the sacrificial layer 212 is not deposited and removed from the substrate (given that all other steps in the fabrication process are the same).

In one implementation, the sacrificial layer 212 is about 10 nanometers thick. In another implementation, the sacrificial layer 212 is approximately 10 nanometers or less thick (but greater than 0 nm). In yet another implementation, the sacrificial layer 212 is approximately 1-10 nanometers thick.

The high-κ dielectric layer 220 has an EOT of 3 angstroms, while the interfacial oxide layer 214 has an EOT of 3 angstroms.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a transistor, the method comprising:
   forming a dummy gate on a substrate with spacers on both sides of the dummy gate;
   forming a source and a drain in the substrate, the source and the drain positioned under the spacers;
   forming an interlayer dielectric on top of the substrate, the spacers, and the dummy gate;
   planarizing the interlayer dielectric along with part of the spacers and the dummy gate;
   removing the dummy gate, thereby leaving an opening;
   depositing a sacrificial layer on top of the substrate in a bottom of the opening, the sacrificial layer comprising at least one of silicon germanium and germanium;
   removing the sacrificial layer from the substrate in the bottom of the opening, thereby growing an interfacial oxide layer on the substrate in the opening; and
   depositing a high-κ dielectric layer on top of the interfacial oxide layer.

2. The method of claim 1, further comprising depositing a work function metal on top of the high-κ dielectric layer.

3. The method of claim 2, further comprising depositing a low resistance metal on top of the work function metal.

4. The method of claim 1, wherein the equivalent oxide thickness (EOT) of the interfacial oxide layer and the high-κ dielectric layer is 6 angstroms.

5. The method of claim 4, wherein for the EOT of 6 angstroms, an effective work function is 200 millivolts higher than when the sacrificial layer is not deposited and removed from the substrate.

6. The method of claim 1, wherein the sacrificial layer is about 10 nanometers thick.

7. The method of claim 1, wherein the sacrificial layer is 10 nanometers or less thick.

8. The method of claim 1, wherein the sacrificial layer is 1-10 nanometers thick.

9. The method of claim 1, wherein high-κ dielectric layer has an EOT of 3 angstroms.

10. The method of claim 9, wherein the interfacial oxide layer has an EOT of 3 angstroms.

11. A method of forming a transistor, the method comprising:
    depositing a sacrificial layer on top of a substrate, the sacrificial layer comprising at least one of silicon germanium and germanium;
    forming a dummy gate on top of the sacrificial layer with spacers on both sides of the dummy gate;
    forming a source and a drain in the substrate, the source and the drain positioned under the spacers;
    forming an interlayer dielectric on top of the sacrificial layer, the spacers, and the dummy gate;
    planarizing the interlayer dielectric along with part of the spacers and the dummy gate;
    removing the dummy gate, thereby leaving an opening;
    removing the sacrificial layer from the substrate in a bottom of the opening, thereby growing an interfacial oxide layer on the substrate in the opening; and
    depositing a high-κ dielectric layer on top of the interfacial oxide layer.

12. The method of claim 11, further comprising depositing a work function metal on top of the high-κ dielectric layer.

13. The method of claim 12, further comprising depositing a low resistance metal on top of the work function metal.

14. The method of claim 11, wherein an equivalent oxide thickness (EOT) of the interfacial oxide layer and the high-κ dielectric layer together is 6 angstroms.

15. The method of claim 14, wherein for the EOT of 6 angstroms, an effective work function is 200 millivolts higher than when the sacrificial layer is not first deposited and then removed from the substrate.

16. The method of claim 11, wherein the sacrificial layer is about 10 nanometers thick.

17. The method of claim 11, wherein the sacrificial layer is 10 nanometers or less thick.

18. The method of claim 11, wherein the sacrificial layer is 1-10 nanometers thick.

19. The method of claim 11, wherein the high-κ dielectric layer has an EOT of 3 angstroms; and
    wherein the interfacial oxide layer has an EOT of 3 angstroms.

* * * * *